(12) United States Patent
Mohammed et al.

(10) Patent No.: US 10,396,004 B2
(45) Date of Patent: Aug. 27, 2019

(54) REDUCTION OF CROSS TALK IN WLCSP'S THROUGH LASER DRILLED TECHNIQUE

(71) Applicant: Dialog Semiconductor (UK) Limited, London (GB)

(72) Inventors: Habeeb Mohiuddin Mohammed, Wilheim an der Teck (DE); Rajesh Subraya Aiyandra, Denkendorf (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/879,904

(22) Filed: Jan. 25, 2018

(65) Prior Publication Data
US 2019/0229028 A1    Jul. 25, 2019

(51) Int. Cl.
| | | |
|---|---|---|
| *H01L 23/31* | (2006.01) | |
| *H01L 23/498* | (2006.01) | |
| *H01L 23/00* | (2006.01) | |
| *H01L 29/06* | (2006.01) | |
| *B81C 1/00* | (2006.01) | |
| *H01L 21/56* | (2006.01) | |

(52) U.S. Cl.
CPC ...... *H01L 23/3128* (2013.01); *B81C 1/00896* (2013.01); *H01L 21/568* (2013.01); *H01L 23/3114* (2013.01); *H01L 23/49816* (2013.01); *H01L 24/94* (2013.01); *H01L 29/0649* (2013.01); *H01L 2224/0401* (2013.01); *H01L 2224/32225* (2013.01); *H01L 2224/73204* (2013.01)

(58) Field of Classification Search
CPC ............. H01L 23/3128; H01L 23/3114; H01L 23/49816; H01L 21/568; H01L 24/94; H01L 29/0649; H01L 2224/0401; H01L 2224/32225; H01L 2224/73204; B81C 1/00896
USPC ........................................................ 257/680
See application file for complete search history.

(56) References Cited

U.S. PATENT DOCUMENTS

| | | | |
|---|---|---|---|
| 2016/0148882 A1* | 5/2016 | Kim ...................... | H01L 21/561 257/659 |
| 2016/0365326 A1* | 12/2016 | Cho ...................... | H01L 23/585 |
| 2017/0170122 A1 | 6/2017 | Ritter et al. | |

OTHER PUBLICATIONS

"Microvia forming using UV laser," by Bernd Lange, LPKF Laser & Electronics AG, Garbsen, Germany: http://www.lpkfusa.com/articles/hdi/microvia_formation.pdf.

(Continued)

*Primary Examiner* — Tong-Ho Kim
(74) *Attorney, Agent, or Firm* — Saile Ackerman LLC; Stephen B. Ackerman; Rosemary L.S. Pike

(57) ABSTRACT

A wafer level chip scale package is described. The wafer level chip scale package comprises a plurality of redistribution layer (RDL) traces connected to a silicon wafer through openings through a first polymer layer to metal pads on a top surface of the silicon wafer. A plurality of underbump metal (UBM) layers each contact one of the plurality of RDL traces through openings in a second polymer layer over the first polymer layer. A plurality of solder bumps lie on each UBM layer. A metal plating layer lies under the first polymer layer and does not contact any of the plurality of RDL traces. At least one separator lies between at least two of the plurality of RDL traces. The separator is a metal fencing between the two neighboring RDL traces or an air gap between the two neighboring RDL traces.

29 Claims, 16 Drawing Sheets

(56) References Cited

OTHER PUBLICATIONS

Regarding creepage distance definition: https://electronics.stackexchange.com/questions/74244/why-route-air-gaps-for-voltage-isolation-on-pcbs.
Need for Air-gaps in PCB designs: http://electronics.stackexcange.com/questions/173575/air-gap-on-isolation-space.

* cited by examiner

REDUCTION OF CROSS TALK IN WLCSP'S THROUGH LASER DRILLED TECHNIQUE

(1) TECHNICAL FIELD

This disclosure is related to wafer packaging technologies, and more particularly, to reducing cross-talk, copper migration, and leakage currents in wafer level chip scale packaging.

(2) BACKGROUND

Packaging of an Integrated circuit is needed to protect the semiconductor chip/die/Integrated circuit from physical damage that may occur while connecting the chip to the application printed circuit board or during its usage by the customer. Several different packaging types exist in the market including, for example, lead frame packages, ball grid array packages, chip scale packages such as wafer level chip scale packages, and so on.

Among these, a wafer level chip scale package (WLCSP) has the smallest form factor; that is, the package size is the same as the die size, and good electrical, mechanical, and thermal characteristics. It also has a simpler stack up and the assembly processing cost is lower compared to some of the other packaging solutions.

FIG. 1 illustrates the stack-up of a traditional WLCSP. After inspection of the silicon from the wafer fabrication foundry, including silicon 10, aluminum pad 12, and passivation layer 14, a layer 16 of polymer1 is coated and patterned. This is followed by a metal seed layer sputtering having a uniform thickness over the entire chip. This is then followed by the RDL metal plating 18. The thickness of this metal is uniform over the entire chip. Then a layer 20 of polymer2 is processed on the top of RDL. An under ball metal (UBM) layer 22 is first sputtered and then plated. The thickness of this UBM is uniform over the entire chip. This is followed by solder ball 24 placement.

There are several disadvantages of current practice. Most of the assembly suppliers allow a RDL to RDL spacing of at least 10 µm. In the future, as assembly processes advance, it is expected that assembly suppliers will support even <5 µm RDL-RDL spacing. With such low spacing, the chances of having cross-talk between RDL traces will increase. That is, a signal from one trace may be inadvertantly transmitted to the next trace.

Another disadvantage is that the layers between the conducting parts (UBM, RDL) can deteriorate over time because of dirt (pollution), moisture along the surface, humidity, etc. and can thus allow small amounts of current to flow across them, resulting in leakage currents. This phenomenon is also called tracking. If one RDL signal carries a low voltage signal and the neighboring one carries a high voltage signal, then in such cases, deterioration of the polymer can result in electrical shorts or device malfunctioning.

Furthermore, voltage levels on the RDL traces can be one reason for Copper-migration. If the potential difference between the RDL traces is higher, there is a high chance of formation of a conductive path between RDL traces over time; such phenomenon is called copper migration. Copper migration might result in electrical shorts or device malfunctioning.

The usual thickness of the RDL supported by assembly suppliers is at a minimum 4 µm. With such thickness there are chances of wafer warping during the assembly processing. This is the reason why most of the assembly suppliers limit the RDL density to a maximum of 75% for a unit package. This means 25% of the chip is RDL (copper) free, which results in an increase in thermal resistance or a reduced thermal performance.

U.S. Patent Applications 2017/0170122 (Ritter et al) and 2016/0148882 (Kim et al) teach methods of avoiding cross-talk in a WLCSP.

SUMMARY

It is the primary objective of the present disclosure to provide a wafer level chip scale package (WLCSP) with reduced cross-talk, leakage current, and copper-migration between neighboring signals by having metal fences and/or air gaps between signals.

It is a further objective of the disclosure to provide a WLCSP with improved thermal conductivity by having thin metal plating on top of wafer fab passivation.

Yet another objective is to provide a process for fabricating a WLCSP with improved electrical performance and thermal conductivity by forming metal fences and/or air gaps between signals and by plating metal on the wafer passivation layer.

In accordance with the objectives of the present disclosure, a Laser-Drilled Wafer Level Chip Scale Package (LD-WLCSP) is achieved. This wafer level chip scale package comprises a plurality of redistribution layers (RDL) connected to a silicon wafer through openings through a first polymer layer to metal pads on a top surface of the silicon wafer. A plurality of underbump metal (UBM) layers each contact one of the plurality of RDL traces through openings in a second polymer layer over the first polymer layer. A plurality of solder bumps lie on each UBM layer. A metal plating layer lies under the first polymer layer and does not contact any of the plurality of RDL traces. At least one separator lies between at least two of the plurality of RDL traces. The separator is a metal fencing or an air gap isolating a RDL signal from a neighboring RDL signal.

Also in accordance with the objectives of the present disclosure, a method to fabricate a wafer level chip scale package is achieved. A silicon wafer is provided having a passivation layer thereon and openings in the passivation layer to a plurality of metal pads. A metal layer is plated on the passivation layer and not on the metal pads. A first polymer layer is deposited on the metal layer and patterned to provide openings to the plurality of metal pads. A plurality of redistribution layer (RDL) traces are formed over the first polymer layer and connected to the plurality of metal pads. A second polymer layer is deposited over the first polymer layer and the plurality of RDL traces and patterned to provide openings to the plurality of RDL traces. A plurality of underbump metal (UBM) layers are formed, each contacting one of the plurality of RDL traces. A plurality of solder bumps are placed, each on a UBM layer. At least one separator is formed between at least two of the plurality of RDL traces.

One method of forming at least one separator between at least two of the plurality of RDL traces comprises applying a high flux laser beam to the first and second polymer layers in an area between two neighboring RDL traces wherein the laser beam heats and melts the first and second polymer layers and vaporizes the melted first and second polymer layers wherein the vaporized polymer may even be converted to plasma depending on the laser beam strength, leaving openings in the area between the two neighboring RDL traces having the metal plating layer exposed at a bottom of the openings. The openings are desmeared and micro-etched. Thereafter, a metal layer is plated to fill the openings and form metal fencing in the area between the two neighboring RDL traces. Exposed surfaces of the metal fencing are finished with a finishing layer.

Another method of forming at least one separator between at least two of the plurality of RDL traces comprises applying a high flux laser beam to the first and second polymer layers in an area between two neighboring RDL traces wherein the laser beam heats and melts the first and second polymer layers wherein the vaporized polymer may even be converted to plasma depending on the laser beam strength, leaving openings in the area between the two neighboring RDL traces wherein the metal plating layer is not exposed at a bottom of the openings. The openings are desmeared and micro-etched to form air gaps in the area between the two neighboring RDL traces.

Yet another method of forming at least one separator between at least two of the plurality of RDL traces comprises photolithographically patterning the second and first polymer layers in an area between two neighboring RDL traces leaving openings in the area between the two neighboring RDL traces having the metal plating layer exposed at a bottom of the openings. The openings are descummed. A metal layer is plated on sidewalls of the openings, then the openings are filled with a third polymer layer to complete metal fencing in the area between the two neighboring RDL traces.

BRIEF DESCRIPTION OF THE DRAWINGS

In the accompanying drawings forming a material part of this description, there is shown.

DETAILED DESCRIPTION

The present disclosure describes a package and a process for fabricating a wafer level chip scale package (WLCSP) which uses metal/copper plated isolating fences and/or grooved/notched air-gaps to reduce cross talk, leakage currents, and copper-migration between neighboring signals. The disclosed package and process also improves the thermal conductivity of the package in a far better way than existing chip scale packaging.

Other advantages of the WLCSP of the present disclosure include:

Similar form factor compared to traditional WLCSP.

Similar process flow compared to traditional WLCSP.

Easy-to-use sub 10 μm redistribution layer (RDL) to RDL design spacing rule in the future without having to consider the problem of cross coupling.

Width of copper fence can be reduced to smaller widths (<10 μm). Thus the copper fence is easy and flexible to use for physical placement and has an uncomplicated layout. Only a small portion of chip area is required for the fencing and this portion will not affect the chip size.

WLCSP's could be used in the future for high voltage applications.

Figure 1:
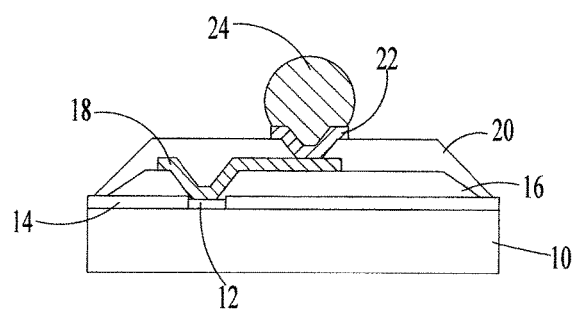
FIG. 1 is a cross-sectional representation of a wafer level chip scale package of the prior art.
Figure 2:
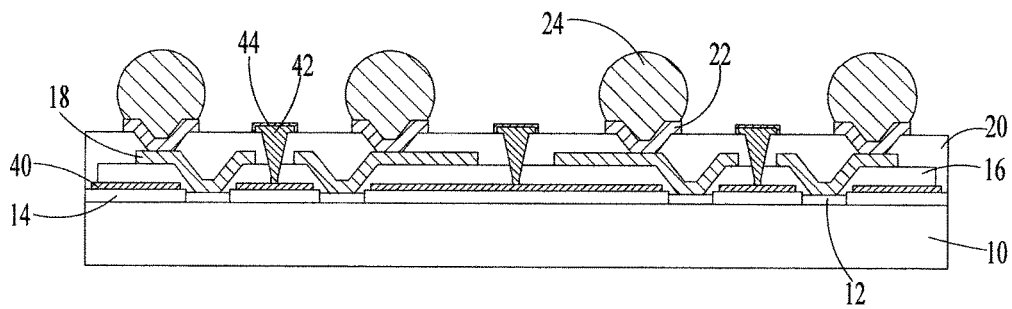
FIG. 2 is a cross-sectional representation of a first embodiment of a wafer level chip scale package of the present disclosure.

In order to reduce the cross capacitance between the signals at the packaging level, a copper fence between signals is introduced. FIG. 2 is a cross-sectional representation of a WLCSP of the present disclosure having copper fences between signals. The WLCSP in FIG. 2 is similar to that in FIG. 1, having RDL 18 contacting metal pad 12 on silicon wafer 10 through an opening in the passivation 14 and polymer layer 16. UBM 22 contacts RDL 18 through openings in the polymer layer 20. Solder balls 24 contact the UBM 22. Several RDL traces or signals 18 are shown. Metal/copper fencing 42 is formed between or around all signals or between or around certain critical signals. Additionally, a thin layer of metal/copper 40 is formed on the wafer passivation layer 14. This metal/copper layer 40 makes electrical contact with the metal/copper fencing 42, but not with the RDL signal paths 18. A surface finishing layer 44 coats the metal-copper fencing 42.

Figure 3:
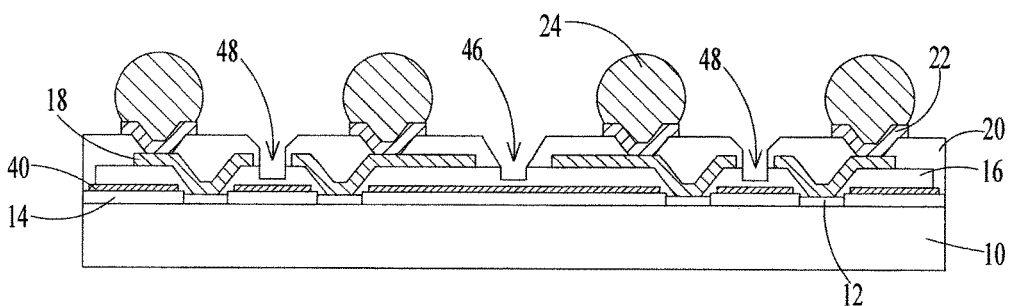
FIG. 3 is a cross-sectional representation of a second embodiment of a wafer level chip scale package of the present disclosure.

FIG. 3 illustrates an alternative second embodiment WLCSP of the present disclosure. In this WLCSP, groove 46 or slot/notch 48 shaped air gaps are formed between or around all signals or between or around certain critical signals. The air gaps do not contact the metal/copper layer 40 on the water passivation layer.

Figure 4:
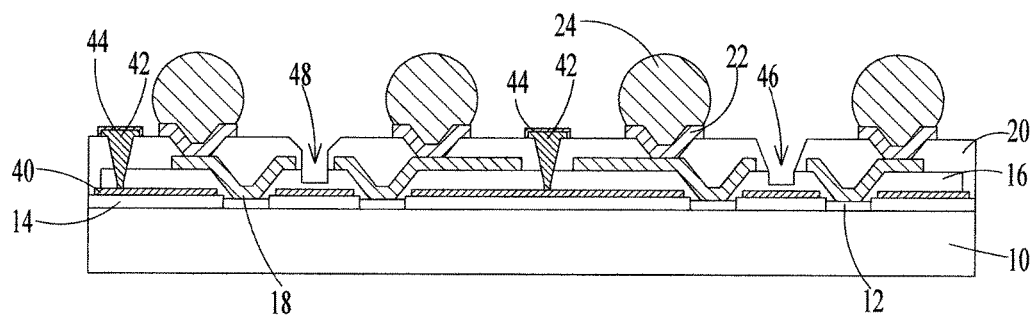
FIG. 4 is a cross-sectional representation of a third embodiment of a wafer level chip scale package of the present disclosure.

FIG. 4 illustrates a third embodiment in which both metal/copper fences 42 and air gaps 46/48 are used between or around all signals or between or around certain critical signals.

Figure 5:
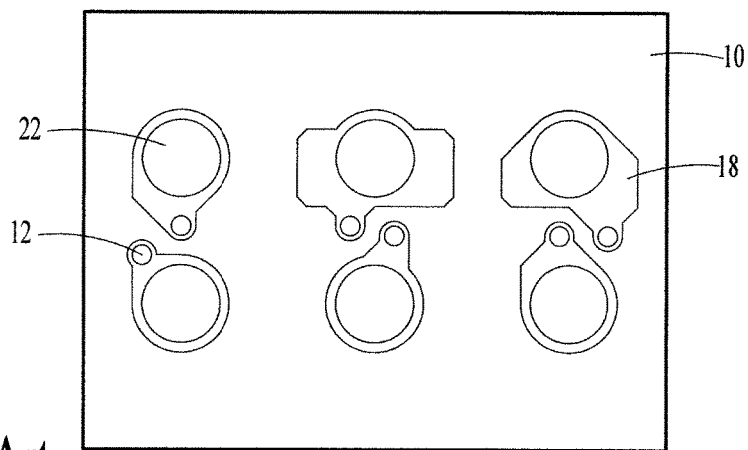
FIG. 5 is a top view of a wafer level chip scale package of the prior art.
Figure 6:
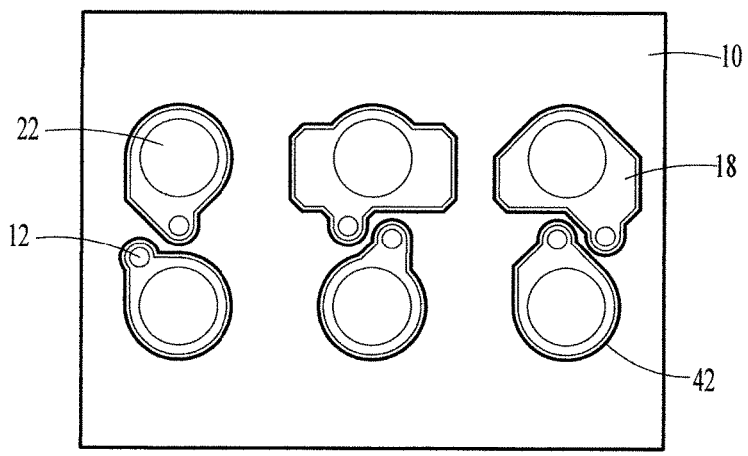
FIG. 6 is a top view of the first embodiment of the wafer level chip scale package of the present disclosure.

FIG. 5 illustrates a top view of a traditional WLCSP design showing the chip 10, wafer passivation openings to metal pads 12, RDL 18, and UBM 22. In order to reduce cross capacitance between signals at the packaging level, the present disclosure introduces copper fencing between signals. FIG. 6 is a top view of the WLCSP of the present disclosure showing the copper fences 42 surrounding the signals.

Figure 7:
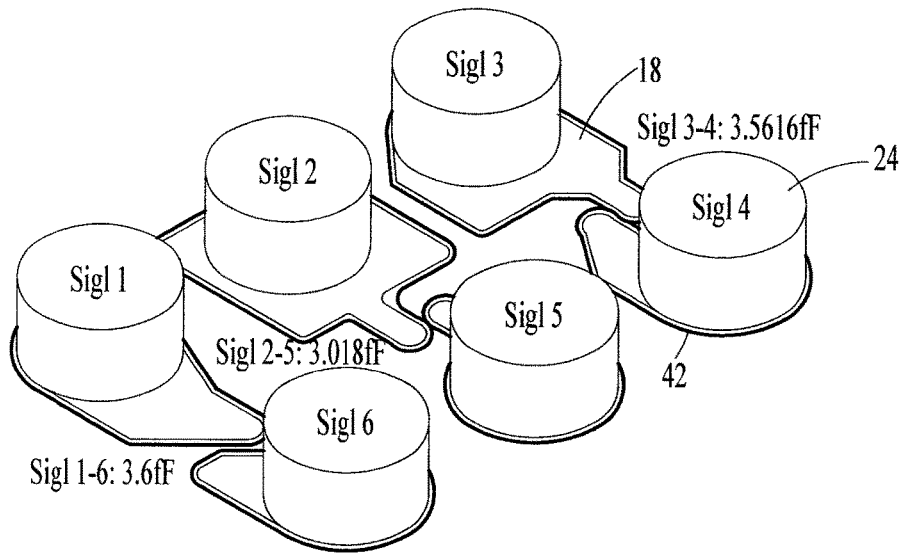
FIG. 7 is an isometric representation of the wafer level chip scale package of the present disclosure with signals and cross coupling capacitance values between them (also shown in Table 1).

The width of the copper fence used in the design was 2 μm. A cross coupling extraction simulation was done for both traditional WLCSP and the laser-drilled WLCSP (LD-WLCSP) of the present disclosure. At a frequency of 5 GHz, the simulations show that having the copper fence reduces the cross coupling by almost 50%. Table 1 shows the cross capacitance comparison between WLCSP and LD-WLCSP with copper fence. FIG. 7 illustrates the signals in the simulation for the LD-WLCSP with solder balls 24, RDL 18, and copper fencing 42.

TABLE 1

| Signals (Sigl) | traditional WLCSP (femto Farads fF) | LD-WLCSP with copper fence (femto Farads fF) |
|---|---|---|
| Sigl1-Sigl2 | 5.7567 | 3.0369 |
| Sigl2-Sigl3 | 6.102 | 3.015 |
| Sigl3-Sigl4 | 8.4931 | 3.5616 |
| Sigl4-Sigl5 | 5.0648 | 2.90131 |
| Sigl5-Sigl6 | 4.7989 | 3.0055 |
| Sigl1-5igl6 | 8.3229 | 3.64 |
| Sigl2-Sigl5 | 7.896 | 3.018 |

In traditional WLCSP's, the polymer (1 and 2) present between conducting parts (UBM, RDL) can deteriorate over time because of various reasons such as dirt (pollution), moisture along the surface, humidity, etc. and can allow small amounts of current to flow across them (arching/arch-over), thus resulting in leakage currents. This phenomenon is also called tracking. If one RDL signal carries a low voltage signal and the neighboring one carries a high voltage signal, then in such cases, deterioration of the polymer can result in electrical shorts or device malfunctioning.

Figure 8:
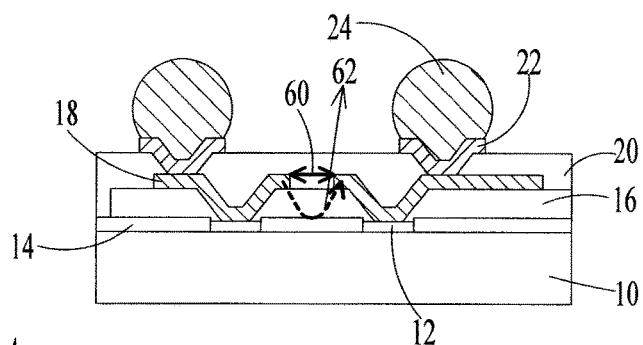
FIG. 8 is a cross-sectional representation of a wafer level chip scale package of the prior art.

Copper-migration can result in an undesired conductive path between adjacent RDL tracks. The voltage levels on the RDL tracks can be one reason for copper-migration. FIG. 8 illustrates a traditional WLCSP. Creepage distance 60 is the shortest path between two conducting parts measured along the surface of insulation. In traditional WLCSP's, over time, deterioration of the polymers in tandem with having low creepage distances in the design would result in easy leakage currents 62. Deterioration of the polymer layers results in reduction of the insulating property of the polymer layers. Over time, the deteriorating polymer becomes a conductor conducting very small currents.

If the voltage difference between the neighboring conductive parts is higher, designs having lower creepage distances would be more prone to the phenomenon of copper-migration as well. If the potential voltage difference between the RDL copper traces is large enough, one trace acts as a cathode and the other as an anode. That is, copper ions from one of the RDL traces migrate to another of the RDL traces. This migration results in a conducting path (of copper) formation between RDL traces, thereby resulting in a short.

Figure 9:
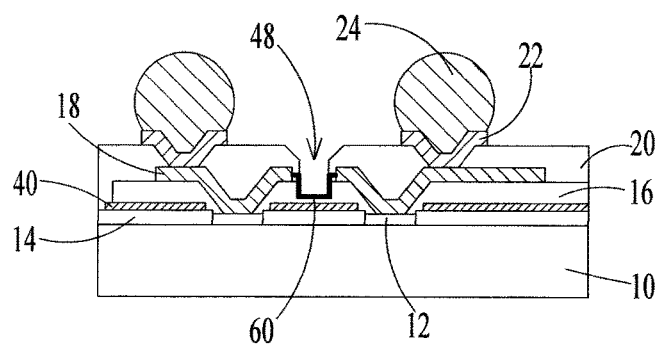
FIG. 9 is a cross-sectional representation of the second embodiment of a wafer level chip scale package of the present disclosure.

FIG. 9 illustrates the LD-WLCSP using air gaps. Under certain conditions (humidity, moisture, contamination, etc), the air gap 48 has a higher break down voltage level than the polymers in the package; hence, having air gaps would help achieve larger creepage distances 60, without having to increase the chip size and help in preventing leakage currents or copper-migration.

Figure 10:
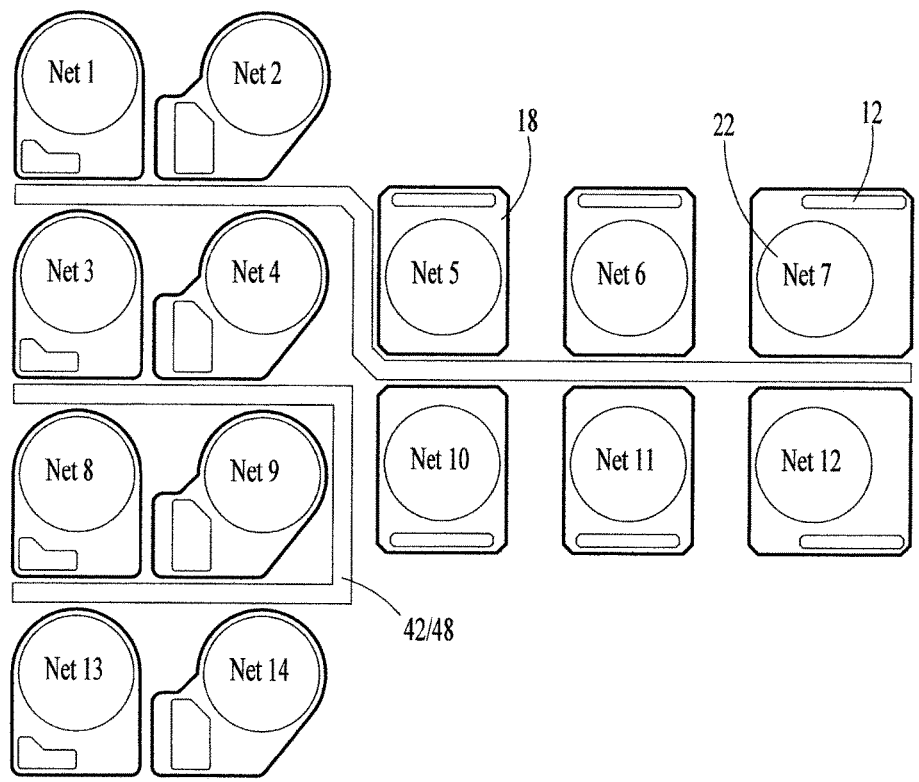
FIG. 10 is a top view of the wafer level chip scale package of the present disclosure with signal locations. Cross coupling capacitance values of these signals are shown in Table 2.

A cross coupling extraction simulation was done for traditional WLCSP, LD-WLCSP with copper fence, and LD-WLCSP with air-gaps. For the same design, and under the same AC conditions (frequency of 5 GHz), the simulation results show that having copper fencing would reduce the cross coupling further in comparison to having LD-WLCSP with air-gaps and traditional WLCSP. FIG. 10 illustrates a top view of the 3D model for LD-WLCSP with copper fence 42 or air gaps 48 used for the extractions. Table 2 gives the cross coupling capacitance values for the extractions for the traditional WLCSP, LD-WLCSP with copper fence, and LD-WLCSP with air gaps.

TABLE 2

| Signals | Traditional WLCSP (fF) | LD-WLCSP w/copper fence (fF) | LD-WLCSP w/air gaps (fF) |
|---|---|---|---|
| Net1-Net3 | 7.5344 | 4.5752 | 5.0269 |
| Net2-Net4 | 6.7135 | 3.7109 | 4.1046 |
| Net3-Net8 | 7.2889 | 4.4117 | 4.846 |
| Net4-Net5 | 5.3524 | 3.0232 | 3.2748 |
| Net4-Net9 | 6.3424 | 3.4415 | 3.8164 |
| Net6-Net11 | 5.3627 | 3.2138 | 3.4507 |
| Net8-Net13 | 7.5125 | 4.6297 | 5.0727 |
| Net10-Net5 | 5.3199 | 3.0162 | 3.2587 |
| Net12-Net7 | 7.5676 | 4.7351 | 5.0828 |
| Net14-Net9 | 6.7559 | 3.7056 | 4.0905 |

It is clear from the extraction results that having LD-WLCSP with metal fencing is better than the traditional WLCSP with respect to cross coupling and noise reduction. LD-WLCSP with air-gaps increases the creepage distances. Under certain conditions (humidity, moisture, contamination, etc.), breakdown voltage of air is better than breakdown voltage of polymers, which means the conduction path will have to find a way around the air-gap. Hence, having LD-WLCSP with air-gaps is better in devices with high voltage applications in order to prevent copper-migration and leakage currents over time. Besides reducing cross coupling, preventing copper-migration and leakage currents, LD-WLCSP will have a reduced thermal resistance and will perform better than traditional WLCSP's. In addition to the presence of metal fences around the RDL traces, the thin layer of metal plating (<=2 μm) on top of the wafer passivation layer will further help reduce the thermal resistance.

Unlike in traditional WLCSP's, where large RDL to RDL spacing is needed to prevent copper-migration between adjacent signals of high potential difference, in LD-WLCSP such large RDL-RDL spacing is not needed. The air-gap between or around some or all of the RDL traces/signals would help isolate each RDL signal from the neighboring one, thus preventing copper-migration without having to have large RDL to RDL spacing and without having to increase the chip size. Air gaps need not be around each RDL signal. Hence LD-WLCSP helps in reducing chip size.

Figure 11:
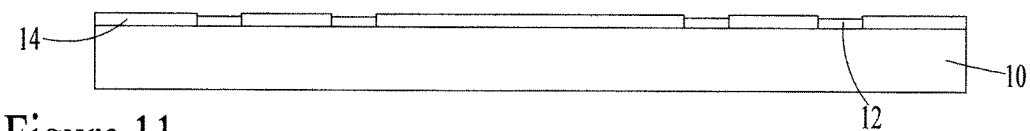
FIGS. 11-24 are cross-sectional representations of steps in a process to fabricate the wafer level chip scale package of the present disclosure.

Referring now to FIGS. 11-31, a first preferred embodiment of the process of fabricating a LD-WLCSP with metal fencing will be described in detail. Referring now to FIG. 11, a silicon wafer 10 is provided having openings through a passivation layer 14 to metal pads 12.

Figure 12:
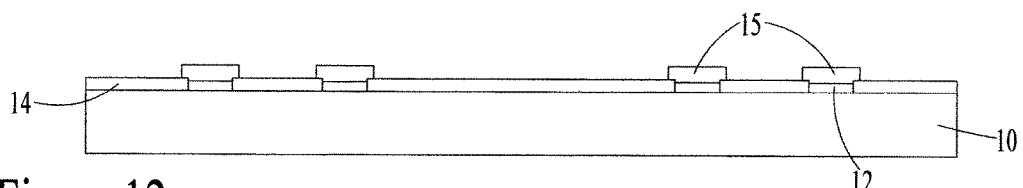
Figure 13:
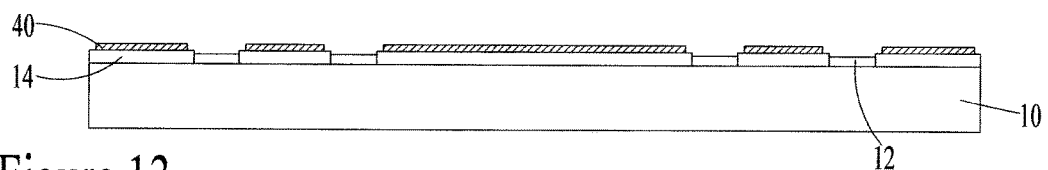

In a departure from the traditional process in FIG. 12, a photoresist layer is coated on the wafer, exposed, and developed to form photoresist pattern 15 covering the exposed metal pads 12 and a portion of the surrounding passivation layer. A thin metal plating 40 is formed on the wafer passivation layer not covered by the photoresist 15. The metal can be copper or any other plating metal such as gold or aluminum or alloys of copper, gold, and/or aluminum having a thickness of less than or equal to about 2 μm, as shown in FIG. 13. It is recommended that the overlap S1 (shown in FIG. 44) between the thin metal openings provided by photoresist pattern 15 and the passivation layer 14 openings be at least 10 μm.

Figure 14:
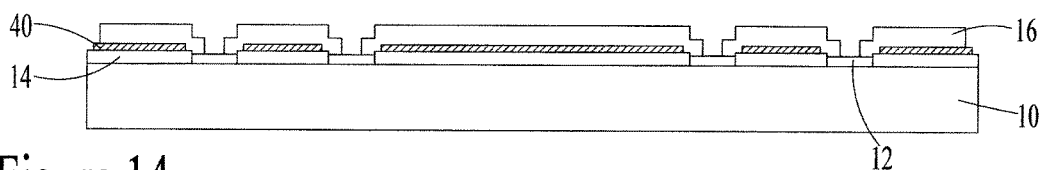

In FIG. 14, first polymer layer 16 is deposited, then patterned to provide openings for the RDL layer. Polymer layer 16 may be polyimide, polybenzoxazole, or any other polymer. The thickness of the polymer layer 16 may be greater than or equal to 7.5 μm.

Figure 15:
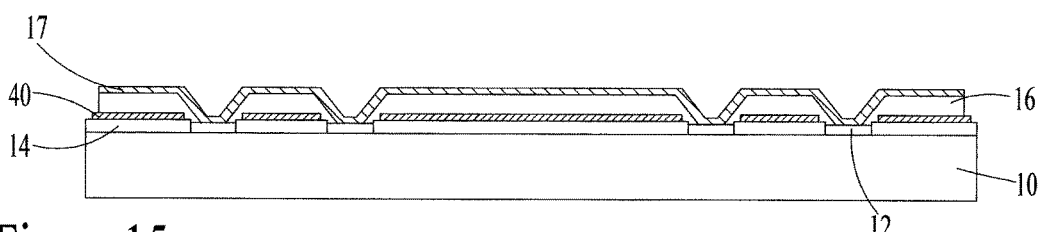

Now, as shown in FIG. 15, a seed layer 17 is sputter deposited over the polymer layer 16 and contacting the metal plates 12. The layer 17 may be Ti/Cu or any other adhesive or seed layer.

Figure 16:
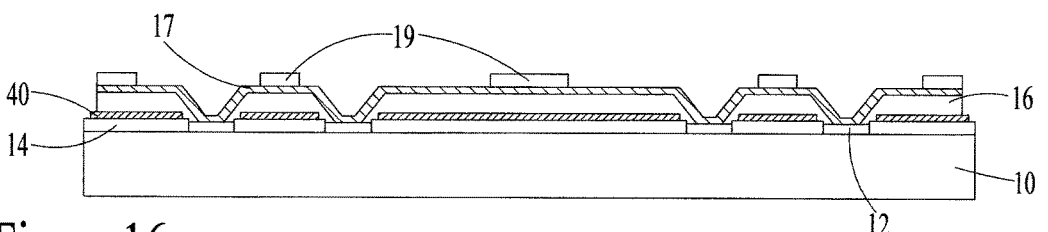
Figure 17:
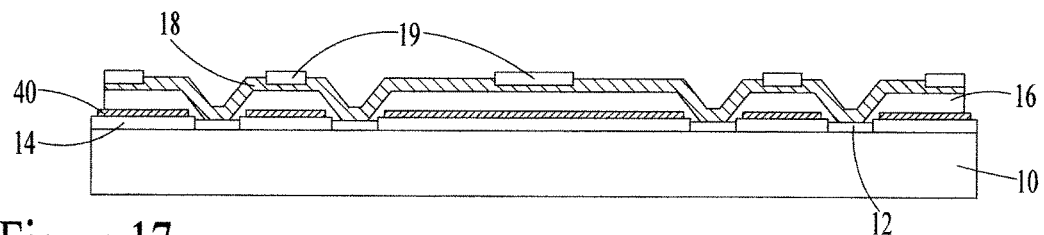
Figure 18:
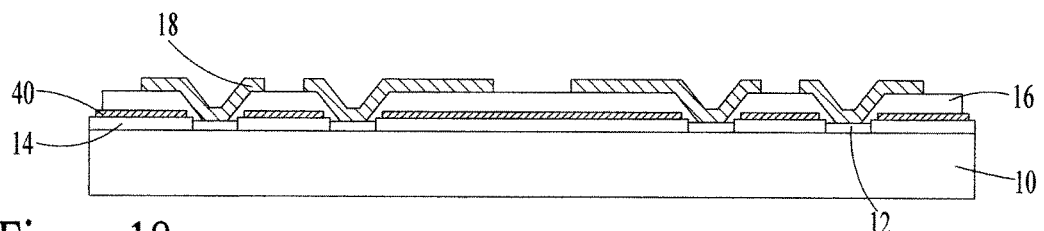

A photoresist layer 19 is coated and patterned as shown in FIG. 16. Redistribution layer (RDL) material is plated on the seed layer where it is not covered by the photoresist pattern 19, as shown in FIG. 17. The photoresist is stripped and the sputtered seed layer is etched away, leaving RDL traces 18, as illustrated in FIG. 18. Preferably, the RDL traces 18 will be greater than or equal to 4 μm and less than or equal to 25 μm in thickness.

Figure 19:
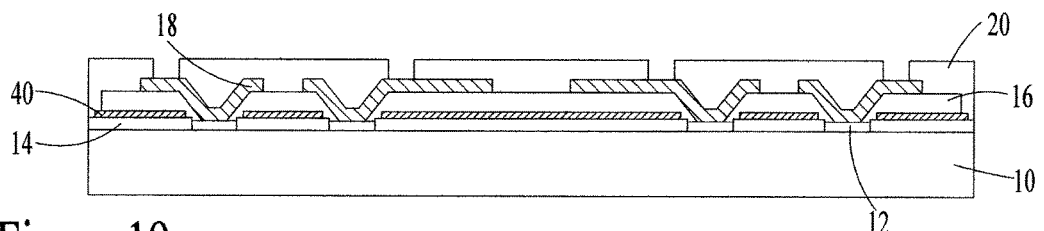

Next, the second polymer layer 20 is coated on the wafer and patterned to provide openings to the RDL traces where UBM contacts will be formed, as shown in FIG. 19. Polymer 2 may be polyimide, polybenzoxazole, or any other polymer. The thickness of the polymer layer may be greater than or equal to 7.5 μm.

Figure 20:
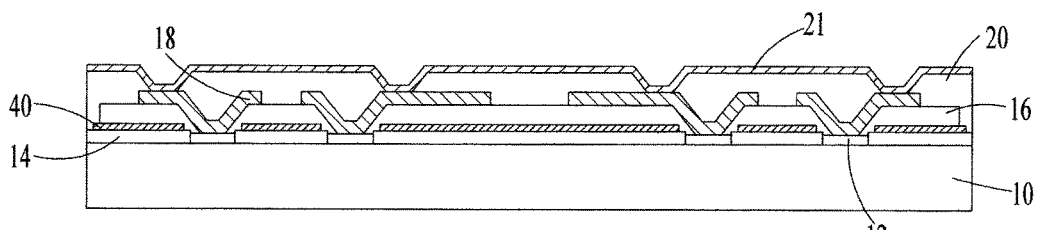

Now, as shown in FIG. 20, a seed layer 21 is sputter deposited over the polymer layer 20 and contacting the RDL traces 18. The layer 21 may be Ti/Cu or any other adhesive or seed layer.

Figure 21:
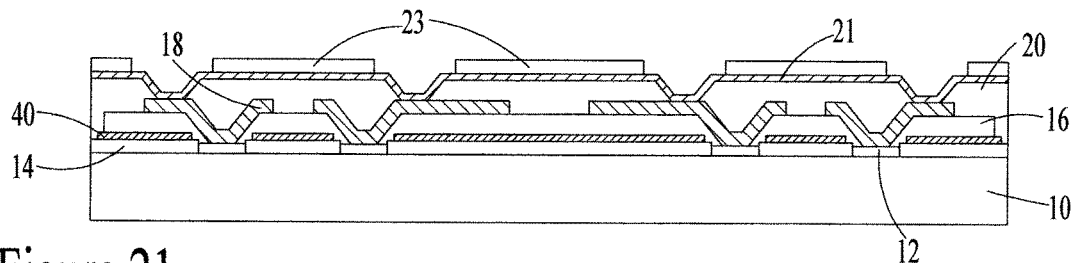
Figure 22:
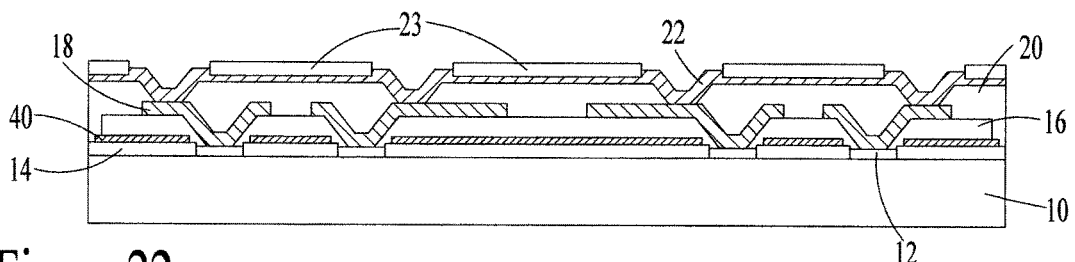
Figure 23:
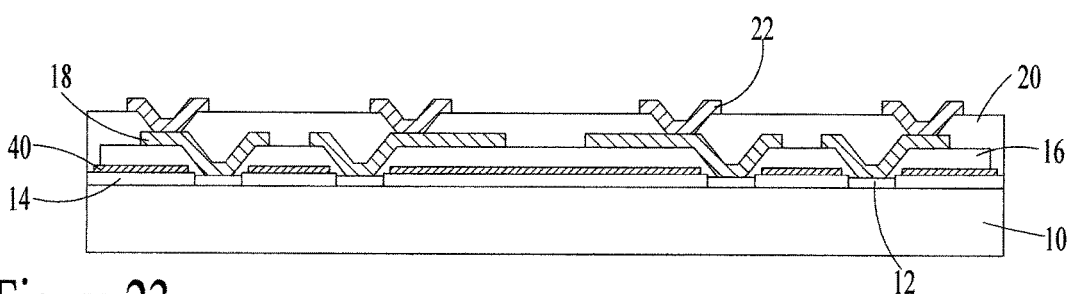
Figure 24:
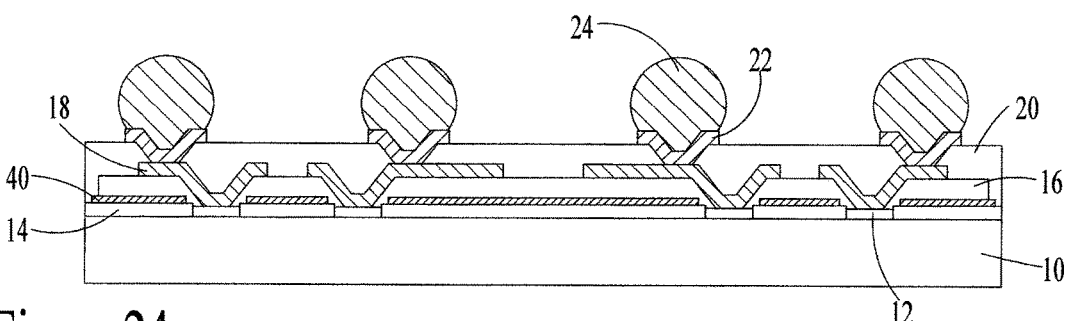

A photoresist layer 23 is coated and patterned as shown in FIG. 21. Under bump metallization (UBM) material 22 is plated on the seed layer where it is not covered by the photoresist pattern 23, as shown in FIG. 22. The photoresist is stripped and the sputtered seed layer is etched away, leaving UBM structures 22, as illustrated in FIG. 23. The UBM structures preferably may be greater than or equal to 8 μm and less than or equal to 25 μm in thickness. Solder balls 24 are placed on the UBM structures 22, as shown in FIG. 24. Solder balls from different vendors providing various alloy combinations such as SAC405 or SAC305, SACQ, etc., may be used.

Figure 25:
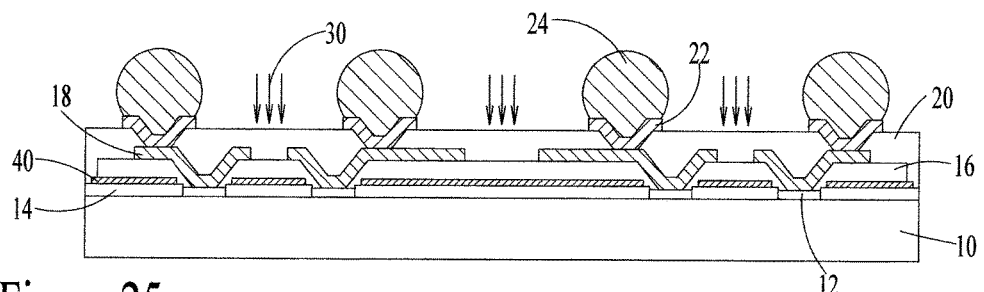
FIGS. 25-31 are cross-sectional representations of additional steps in a process to fabricate the wafer level chip scale package in the first embodiment of the present disclosure.

Now, in a key feature of the present disclosure, metal fencing will be formed to isolate each RDL trace from its neighboring RDL trace or to isolate certain critical RDL traces from neighboring RDL traces. A single metal fencing separator may or may not completely surround one or more RDL traces. A single separator can isolate one or more than one RDL trace from neighboring RDL traces. The metal fencing separator(s) is formed by laser ablation. First, as shown in FIG. 25, a laser beam 30 is applied to the polymer layer 20 with high laser flux.

Different kinds of lasers are available with $CO_2$ and UV lasers being the most commonly used lasers. $CO_2$ lasers emitting infrared light, with a wavelength of between 9.3 μm to 10.6 μm, have limitations in the widths of metal fences they can support, i.e. a minimum of approximately 75 μm width. UV lasers emit ultraviolet light with a wavelength of 355 nm. They have a very small focus which helps in supporting micro widths needed for formation of thin metal fences and air gaps. UV lasers emit light in very short high power pulses which when focused to a particular small spot creates an extremely high power density which further creates very concentrated plasma. Hence, in order to achieve the embodiments mentioned in the present disclosure, a UV laser is recommended.

Figure 26:
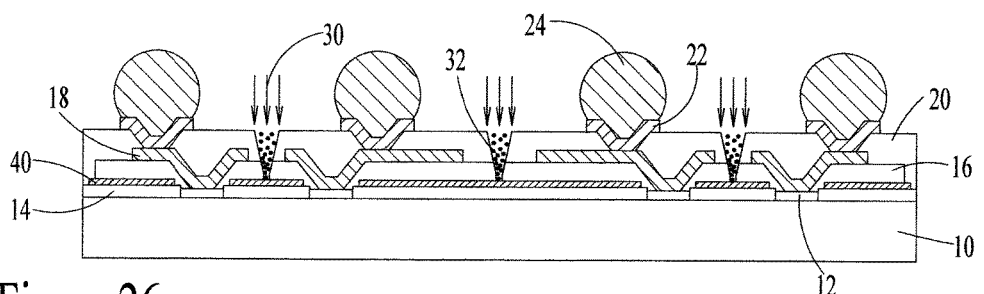
Figure 27:
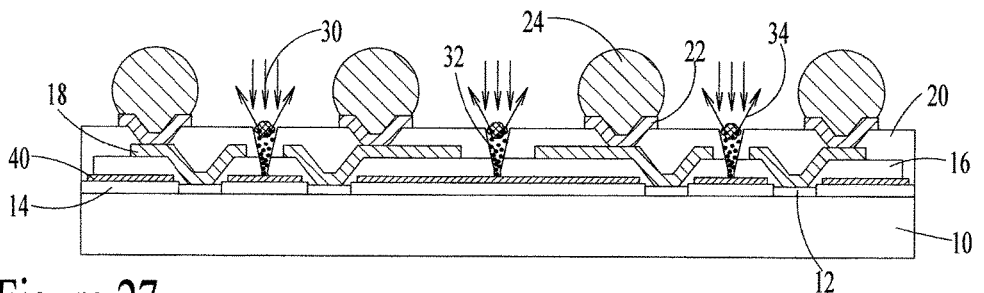
Figure 28:
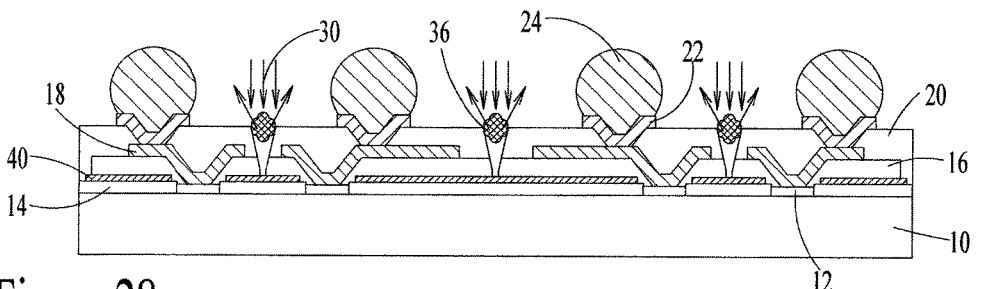
Figure 29:
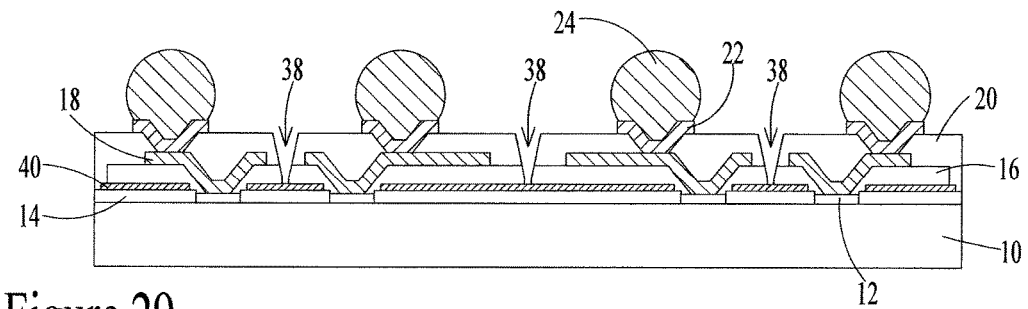

First the laser beam heats the polymer, then melts the polymer. FIG. 26 illustrates melting 32 of the polymers 20 and 16. FIG. 27 illustrates vaporization 34 of the melted polymer. FIG. 28 illustrates a plasma 36 created by the vaporization of the polymer. A plasma need not always be created. Vaporized polymer may be converted to a plasma depending on the strength of the laser beam. After desmearing and micro-etching, the completed openings 38 through the polymers 20 and 16 to the metal plating layer 40 on the wafer passivation 14 are shown in FIG. 29.

Figure 45:
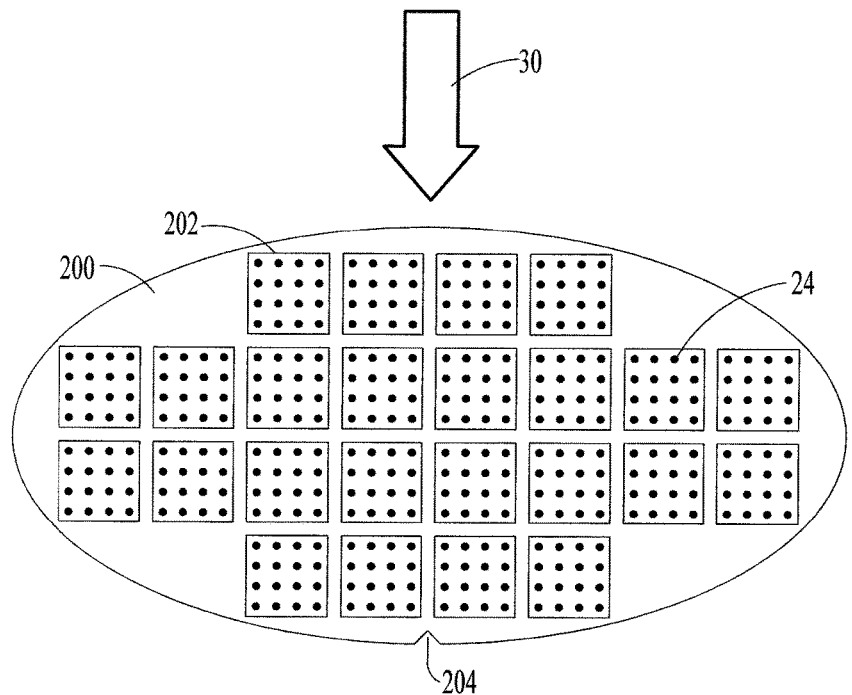
FIGS. 45-48 are top view wafer level representations of a process of forming metal fencing in a first preferred embodiment of the present disclosure.
Figure 46:
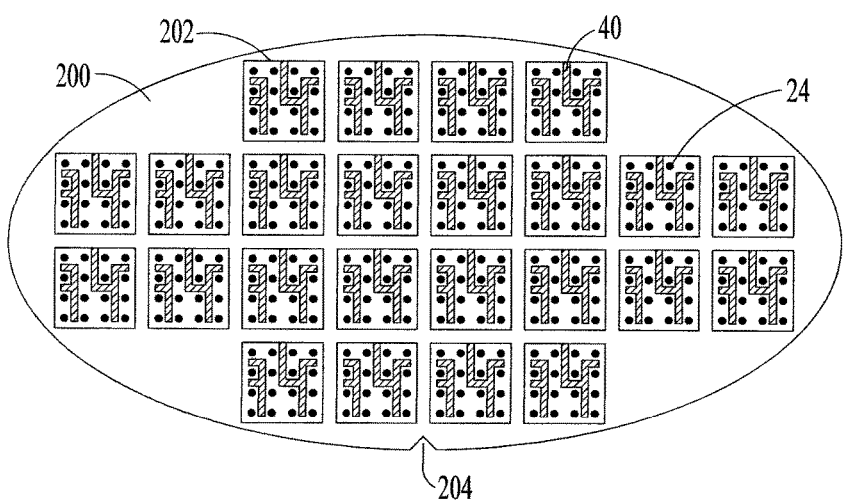

FIGS. 45 and 46 illustrate the formation of the metal fencing on the wafer level. Wafer 200 having wafer notch 204 is shown having a plurality of bumped chips/dies 202. Solder balls 24 are shown. The laser beam 30 is applied to the wafer in FIG. 45 and directed to the precise locations to form the separators. FIG. 46 illustrates the wafer 200 after desmearing and micro-etching where the thin metal layer 40 is exposed within the openings 38.

Figure 30:
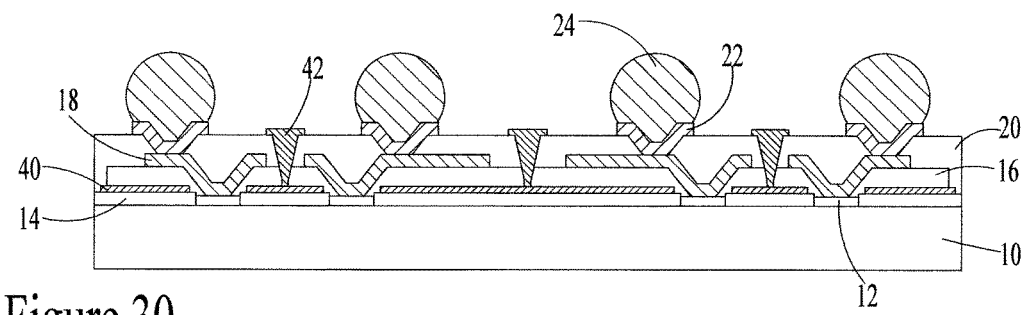
Figure 31:
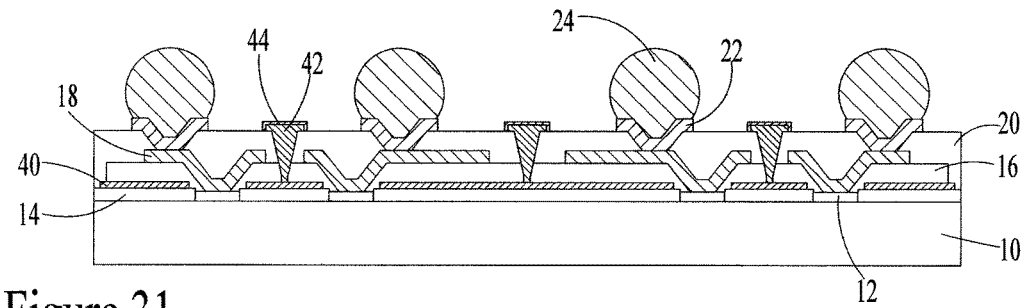
Figure 47:
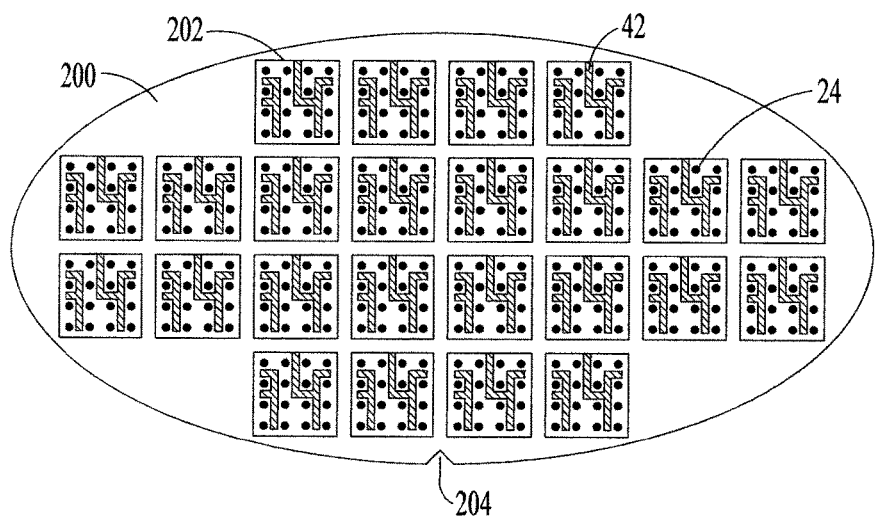
Figure 48:
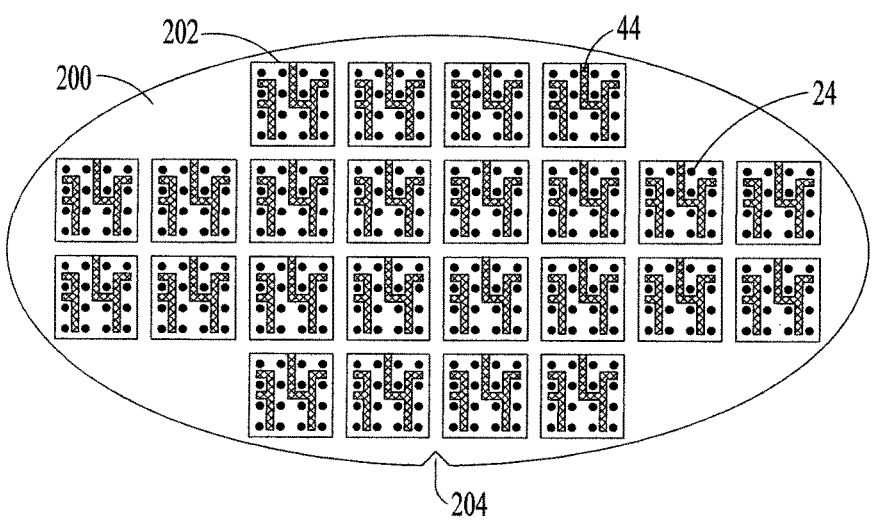

To form the metal fences, copper or other metal, such as gold or aluminum or alloys of copper, gold, and/or aluminum, 42 is, plated into the openings 38, as shown in FIG. 30. FIG. 47 shows the metal plating 42 on the wafer level. Finally, the surfaces of the metal fences 42 are finished with an extra layer such as organic solderability preservatives (OSP), immersion tin (IT), or an electroplated gold layer 44 coated or plated onto the exposed metal surfaces, as shown in FIG. 31 and on the wafer level in FIG. 48. This completes the WLCSP of the first embodiment as shown in FIG. 2.

In a second preferred embodiment of the present disclosure, air gaps are formed in and around each RDL trace or close to certain critical RDL traces. A single air gap separator may or may not completely surround one or more RDL traces. A single separator can isolate one or more than one RDL trace from neighboring RDL traces. The process is identical to the first embodiment through the placing of solder balls in FIG. 24. Laser ablation is similar to the first embodiment except that the intensity of the laser beam is adjusted such that the laser drilling is stopped before the openings reach the level of the metal plating 40.

Figure 32:
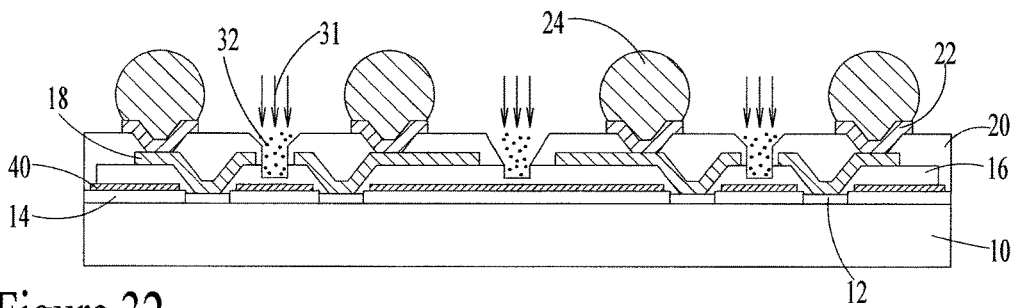
FIGS. 32-35 are cross-sectional representations of additional steps in a process to fabricate the wafer level chip scale package in the second embodiment of the present disclosure.
Figure 33:
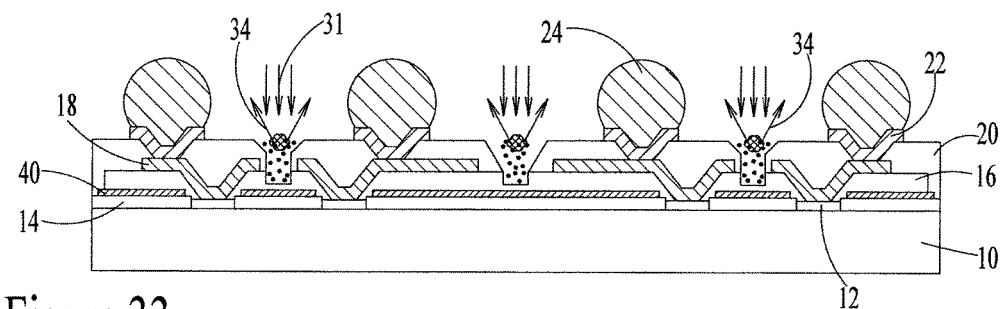
Figure 34:
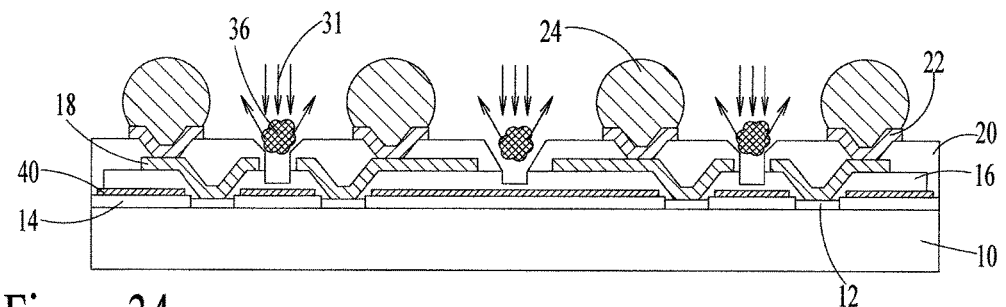
Figure 35:
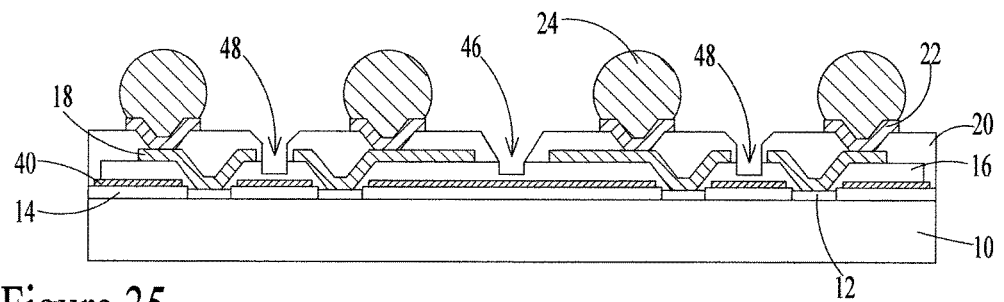
Figure 49:
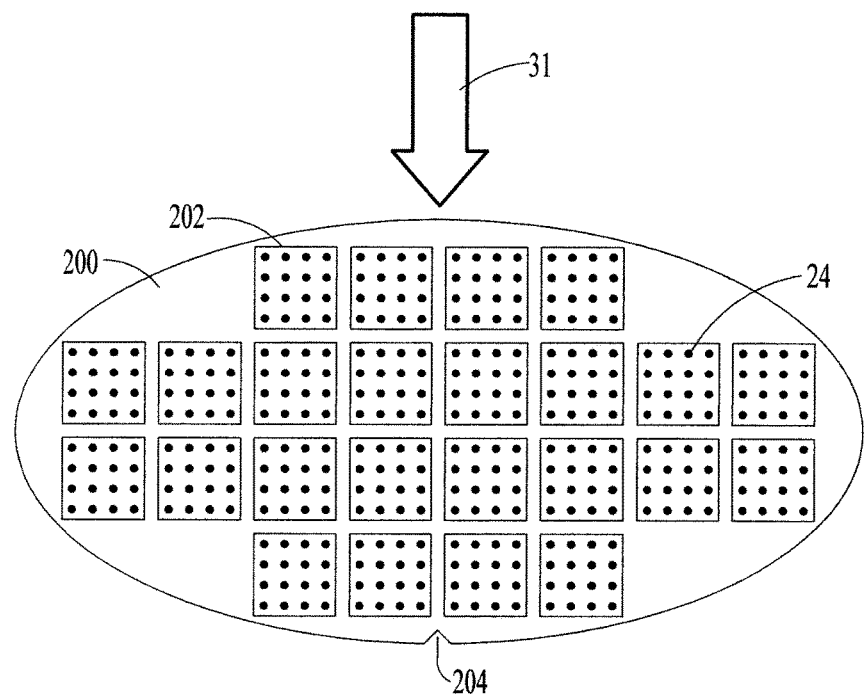
FIGS. 49-50 are top view wafer level representations of a process of forming air gaps in a second preferred embodiment of the present disclosure.
Figure 50:
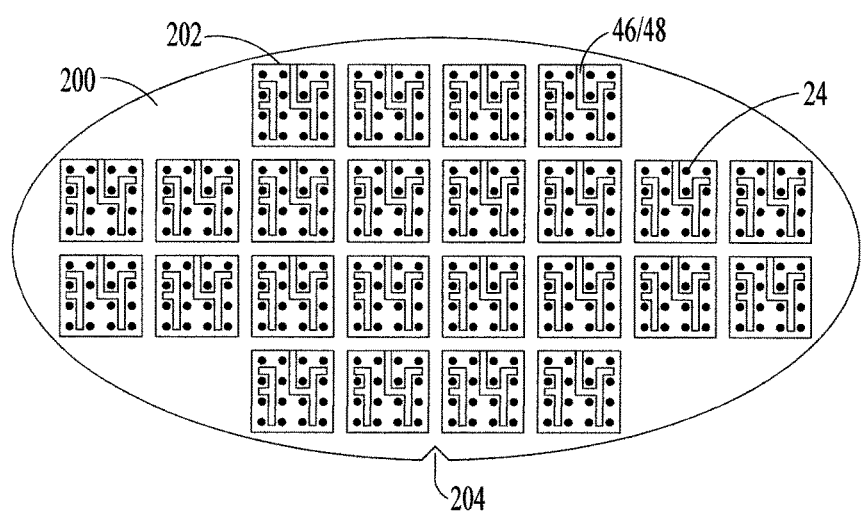

First the laser beam 31 heats the polymer, then melts the polymer. FIG. 32 illustrates melting 32 of the polymers 20 and 16. FIG. 33 illustrates vaporization 34 of the melted polymer. FIG. 34 illustrates a plasma 36 created by the vaporization of the polymer. Vaporized polymer may be converted to a plasma depending on the strength of the laser beam. FIG. 49 illustrates the laser beam 31 application on the wafer level. After desmearing and micro-etching, air gaps 46 and/or 48 are formed, as shown in FIG. 35 and on the wafer level in FIG. 50. Either or both of the groove 46 or slot or notch-shaped air gap 48 can be created by controlling the way the laser is subjected to the wafer. This completes the WLCSP of the second embodiment as shown in FIG. 3.

The WLCSP of the third embodiment, shown in FIG. 4, having both metal fences 42 and air gaps 46 and 48 can be fabricated using a combination of the laser ablation and finishing steps shown in the embodiments 1 and 2.

Figure 36:
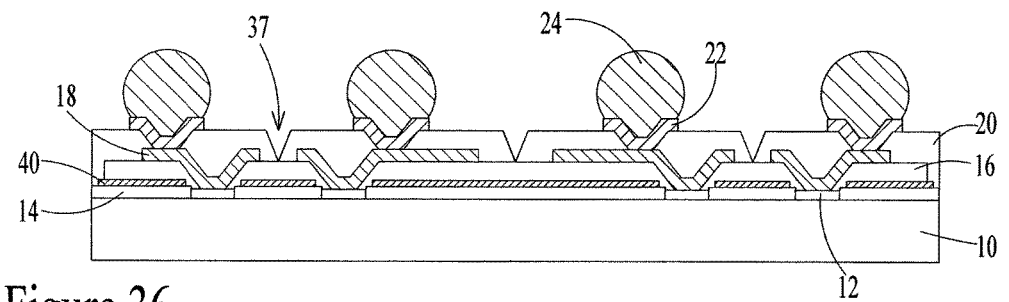
FIGS. 36-39 are cross-sectional representations of alternative steps in a process to fabricate the wafer level chip scale package in the first embodiment of the present disclosure.
Figure 37:
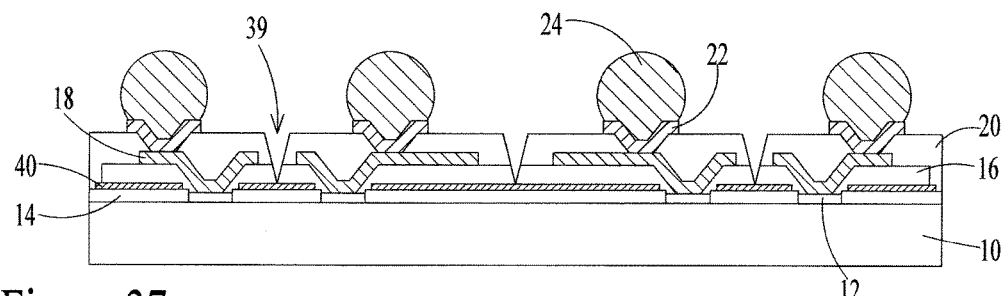

In a variation of the first embodiment, instead of using a laser drilling technique, after solder ball placement in FIG. 24, the polymer 20 may be patterned as shown in FIG. 36 using a photolithography process to form openings 37. Next, as shown in FIG. 37, polymer 16 is patterned using a photolithography process to extend the polymer 20 openings 37 through polymer 16 to the metal plating layer 40 to form openings 39.

Figure 38:
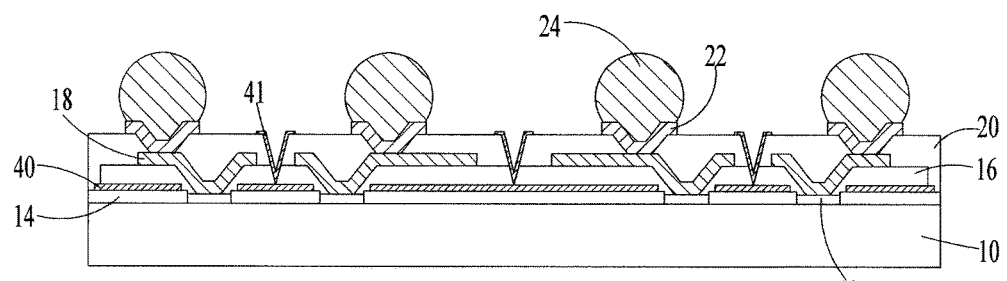
Figure 39:
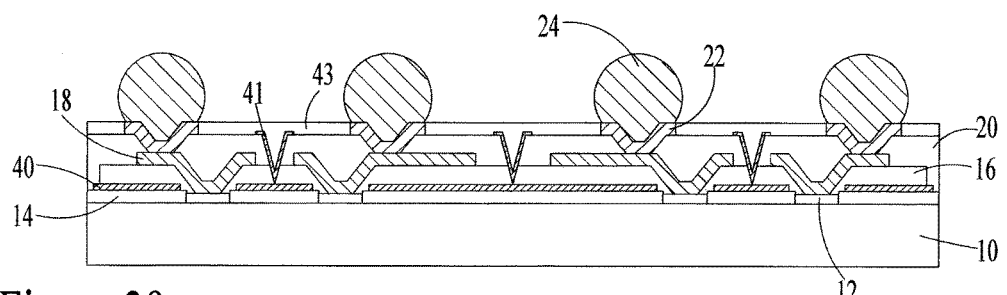

As illustrated in FIG. 38, a copper or other metal such as gold or aluminum or alloys of copper, gold, and/or aluminum 41 is plated on the sidewalls of the openings 39 using a photoresist pattern, not shown, having openings where the metal is to be plated. Now, using another photolithography process, a third polymer layer 43 is coated over the polymer layer 20 and on top of the plated metal 41 within the openings, as shown in FIG. 39. The third polymer layer 43 may comprise polyimide, polybenzoxazole, or any other polymer having a thickness greater than or equal to 0.3 µm.

Figure 40:
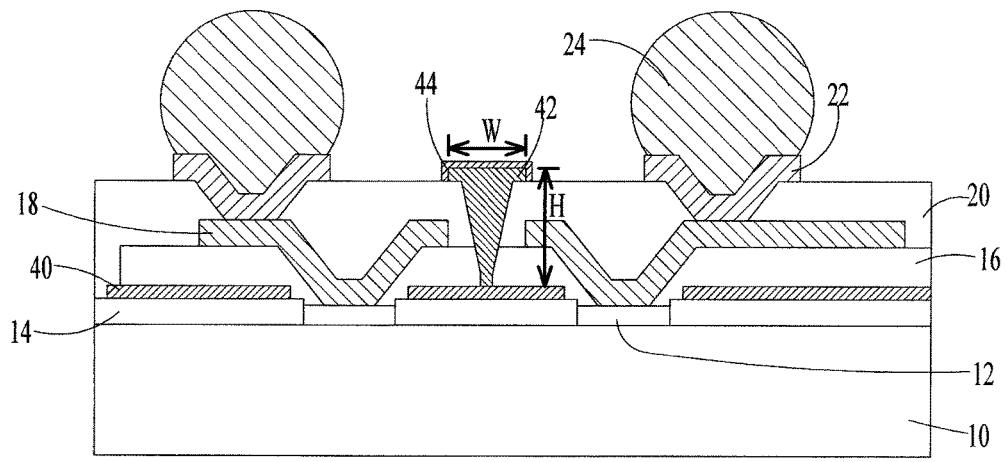
FIGS. 40-41 are cross-sectional representations of metal fencing sizes in the first preferred embodiment of the present disclosure.
Figure 41:
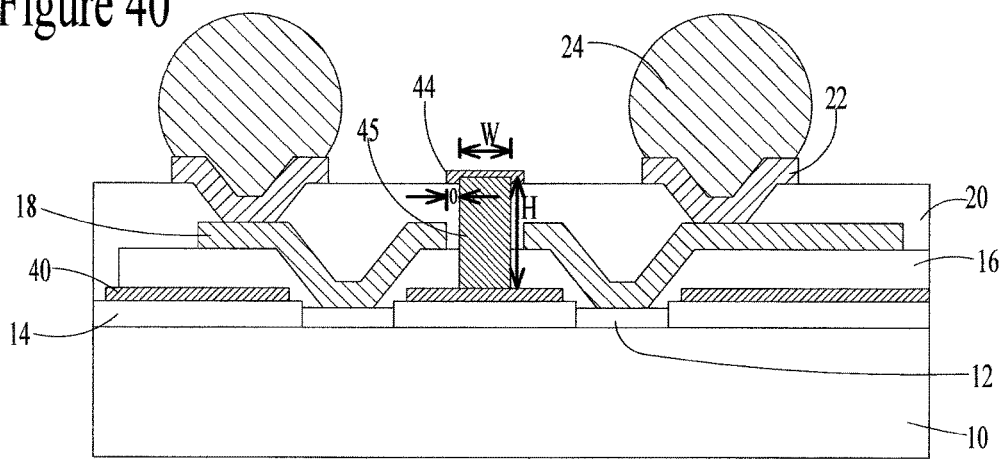

FIGS. 40 and 41 illustrate preferred metal fencing dimensions of the present disclosure. FIG. 40 shows cone-shaped metal fencing 42 having a minimum width W of 2 µm and a minimum height H of 15 µm. FIG. 41 shows a rectangular or cylindrical shaped metal fencing 45 having the same minimum width W and height H as in FIG. 40. The maximum depth of the metal fencing 42/45 is based on the depth into the polymer layers of the thin metal plating 40 since the metal fencing must touch the thin metal plating. The overlap O of the surface finishing 44 on each side of the metal fencing is defined based on the manufacturing tolerances of the metal fencing width. For a metal fence width of 2 µm, if the tolerance is 0.5 µm, an overlap of 0.25 µm is required. This is to make sure that if the manufactured metal width is 2.5 µm, then the surface finishing still covers the metal fencing. A recommended minimum thickness of the surface finishing layer 44 is 0.3 µm.

Figure 42:
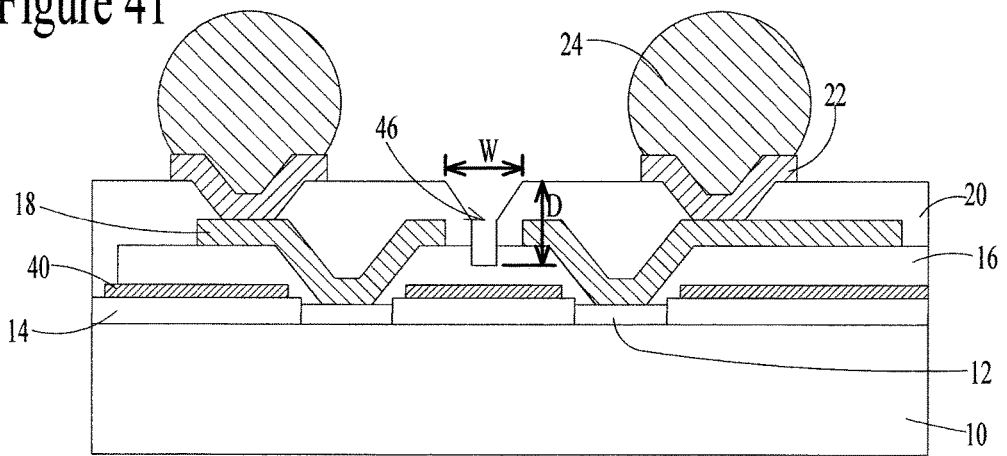
FIGS. 42-43 are cross-sectional representations of air gap sizes in a second preferred embodiment of the present disclosure.
Figure 43:
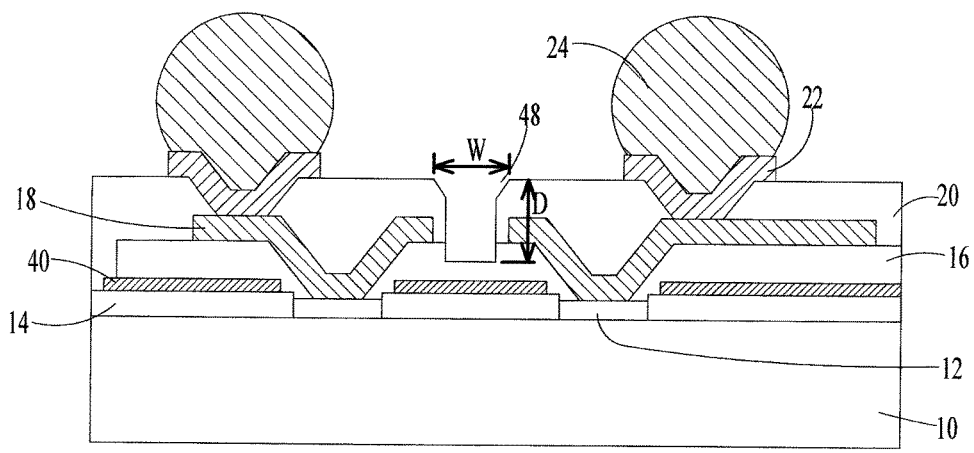

FIGS. 42 and 43 illustrate preferred air gap fencing dimensions of the present disclosure. FIG. 42 shows grooved-shaped air gap 46 having a minimum width W of 2 µm and a maximum depth D of less than 15 µm, assuming polymer1 and polymer2 are each 7.5 µm thick. The depth D can be greater than 15 µm if the polymer thicknesses are greater than 7.5 µm. It is necessary that the thin metal layer 40 is not exposed by the creation of the air gaps. FIG. 43 shows a notched or slot shaped air gap 48 having the same minimum width W and maximum depth D as in FIG. 42.

Figure 44:
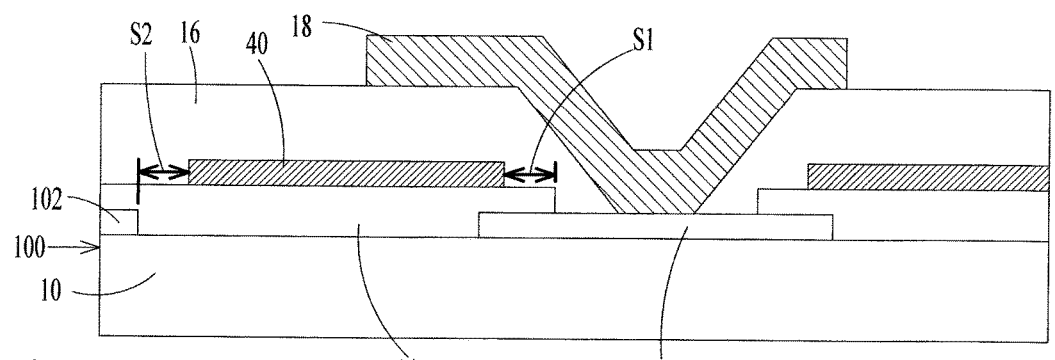
FIG. 44 is a cross-sectional representation of the thin metal plating of the present disclosure and its related spacing recommendations.

FIG. 44 illustrates an enlarged portion of the wafer 10 of the present disclosure showing the silicon die edge 100. S1 shows the minimum overlap between the thin metal layer 40 opening to the wafer fab passivation 14 opening. The minimum overlap S1 is recommended to be about 10 µm. The top metal for the seal ring at the edge of the silicon die is shown by 102. The spacing S2 between the seal ring silicon die top metal edge 102 and the thin metal layer 40 is recommended to be greater than or equal to 25 µm. The recommended maximum thickness of the thin metal layer 40 is 2 µm.

The WLCSP and method of fabrication according to the present disclosure results in a reduction in signal to signal cross talk (coupling capacitance) at the packaging level providing better electrical performance compared to traditional WLCSP's. Copper-migration and leakage currents between RDL traces or signals of high potential differences are prevented by having larger creepage distances. Unlike in traditional WLCSP's, where large RDL to RDL spacing is needed to prevent copper-migration between adjacent signals of high potential difference, in the LD-WLCSP of the present disclosure, such large RDL-RDL spacing is not needed. Hence, LD-WLCSP helps in reducing chip size. Improved thermal performance is also observed compared to traditional WLCSP's.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A wafer level chip scale package comprising:
   a plurality of redistribution layer (RDL) traces connected to a silicon wafer through openings through a first polymer layer to metal pads on a top surface of said silicon wafer;
   a plurality of underbump metal (UBM) layers each contacting one of said plurality of RDL traces through openings in a second polymer layer over said first polymer layer;
   a plurality of solder bumps each on a UBM layer;
   a metal plating layer under said first polymer layer and not contacting any of said plurality of RDL traces; and
   at least one separator lying between at least two of said plurality of RDL traces wherein said at least one separator comprises metal fencing in an area between two neighboring RDL traces wherein said metal fencing makes electrical contact with said metal plating layer.

2. The package according to claim 1 wherein said metal fencing comprises copper, gold or aluminum, or alloys thereof.

3. The package according to claim 1 wherein said metal fencing comprises copper, gold or aluminum, or alloys thereof having a polymer core.

4. The package according to claim 1 wherein said metal fencing has a shape chosen from the group containing: a cone, a rectangle, and a cylinder.

5. The package according to claim 1 wherein said metal fencing has a minimum width of 2 µm and a minimum height of 15 µm.

6. The package according to claim 1 wherein said at least one separator surrounds one or more of said plurality of RDL traces.

7. The package according to claim 1 wherein said at least one separator isolates one or more than one RDL trace from neighboring RDL traces.

8. The package according to claim 1 wherein said metal plating layer comprises copper, gold, or aluminum, or alloys thereof plated on a passivation layer on said silicon wafer and wherein an overlap between an opening in said metal plating layer and an opening in said passivation layer to said metal pads is at least 10 µm, wherein a spacing between a seal ring at an edge of a silicon die and said metal plating layer is greater than or equal to 25 µm, and wherein a maximum thickness of said metal plating layer is 2 µm.

9. The package according to claim 1 wherein said first and second polymer layers comprise polyimide, polybenzoxazole, or any other polymer having a thickness greater than or equal to 7.5 µm.

10. The package according to claim 1 wherein said RDL traces have a thickness of between about 4 and 25 µm and said UBM layers have a thickness of between about 8 and 25 µm.

11. A wafer level chip scale package comprising:
a plurality of redistribution layer (RDL) traces connected to a silicon wafer through openings through a first polymer layer to metal pads on a top surface of said silicon wafer;
a plurality of underbump metal (UBM) layers each contacting one of said plurality of RDL traces through openings in a second polymer layer over said first polymer layer;
a plurality of solder bumps each on a UBM layer;
a metal plating layer under said first polymer layer and not contacting any of said plurality of RDL traces; and
at least one separator lying between at least two of said plurality of RDL traces wherein said at least one separator comprises air gaps between two neighboring RDL traces wherein said air gaps do not contact said metal plating layer.

12. The package according to claim 11 wherein said air gaps have a shape chosen from the group containing: a slot, a notch, and a groove.

13. The package according to claim 11 wherein said at least one separator surrounds one or more of said plurality of RDL traces.

14. The package according to claim 11 wherein said at least one separator isolates one or more than one RDL trace from neighboring RDL traces.

15. The package according to claim 11 wherein said metal plating layer comprises copper, gold, or aluminum, or alloys thereof plated on a passivation layer on said silicon wafer and wherein an overlap between an opening in said metal plating layer and an opening in said passivation layer to said metal pads is at least 10 μm, wherein a spacing between a seal ring at an edge of a silicon die and said metal plating layer is greater than or equal to 25 μm, and wherein a maximum thickness of said metal plating layer is 2 μm.

16. The package according to claim 11 wherein said first and second polymer layers comprise polyimide, polybenzoxazole, or any other polymer having a thickness greater than or equal to 7.5 μm.

17. The package according to claim 11 wherein said RDL traces have a thickness of between about 4 and 25 μm and said UBM layers have a thickness of between about 8 and 25 μm.

18. A wafer level chip scale package comprising:
a plurality of redistribution layer (RDL) traces connected to a silicon wafer through openings through a first polymer layer to metal pads on a top surface of said silicon wafer;
a plurality of underbump metal (UBM) layers each contacting one of said plurality of RDL traces through openings in a second polymer layer over said first polymer layer;
a plurality of solder bumps each on a UBM layer;
a metal plating layer under said first polymer layer and not contacting any of said plurality of RDL traces wherein said metal plating layer comprises copper, gold, or aluminum, or alloys thereof plated on a passivation layer on said silicon wafer and wherein an overlap between an opening in said metal plating layer and an opening in said passivation layer to said metal pads is at least 10 μm, wherein a spacing between a seal ring at an edge of a silicon die and said metal plating layer is greater than or equal to 25 μm, and wherein a maximum thickness of said metal plating layer is 2 μm; and
at least one separator lying between at least two of said plurality of RDL traces.

19. The package according to claim 18 wherein said at least one separator lying between said at least two of said plurality of RDL traces comprises metal fencing in an area between two neighboring RDL traces wherein said metal fencing makes electrical contact with said metal plating layer.

20. The package according to claim 19 wherein said metal fencing comprises copper, gold or aluminum, or alloys thereof.

21. The package according to claim 19 wherein said metal fencing comprises copper, gold or aluminum, or alloys thereof having a polymer core.

22. The package according to claim 19 wherein said metal fencing has a shape chosen from the group containing: a cone, a rectangle, and a cylinder.

23. The package according to claim 19 wherein said metal fencing has a minimum width of 2 μm and a minimum height of 15 μm.

24. The package according to claim 18 wherein said at least one separator between said at least two of said plurality of RDL traces comprises air gaps between two neighboring RDL traces wherein said air gaps do not contact said metal plating layer.

25. The package according to claim 24 wherein said air gaps have a shape chosen from the group containing: a slot, a notch, and a groove.

26. The package according to claim 18 wherein said at least one separator surrounds one or more of said plurality of RDL traces.

27. The package according to claim 18 wherein said at least one separator isolates one or more than one RDL trace from neighboring RDL traces.

28. The package according to claim 18 wherein said first and second polymer layers comprise polyimide, polybenzoxazole, or any other polymer having a thickness greater than or equal to 7.5 μm.

29. The package according to claim 18 wherein said RDL traces have a thickness of between about 4 and 25 μm and said UBM layers have a thickness of between about 8 and 25 μm.

* * * * *